(12) United States Patent
Hattori

(10) Patent No.: US 9,338,910 B2
(45) Date of Patent: May 10, 2016

(54) ELECTRONIC DEVICE AND SEALED STRUCTURE

(71) Applicant: FUJITSU LIMITED, Kawasaki-shi (JP)

(72) Inventor: Ryo Hattori, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 436 days.

(21) Appl. No.: 13/726,108

(22) Filed: Dec. 22, 2012

(65) Prior Publication Data

US 2013/0242477 A1 Sep. 19, 2013

(30) Foreign Application Priority Data

Mar. 16, 2012 (JP) ................................. 2012-059713

(51) Int. Cl.
*H05K 5/06* (2006.01)
*H04M 1/18* (2006.01)
*H04M 1/02* (2006.01)

(52) U.S. Cl.
CPC ............... *H05K 5/069* (2013.01); *H04M 1/026* (2013.01); *H04M 1/18* (2013.01); *H05K 5/061* (2013.01); *H05K 5/062* (2013.01); *H04M 1/0262* (2013.01); *Y10T 428/13* (2015.01)

(58) Field of Classification Search
CPC ......... H05K 5/0039; H05K 1/18; H05K 3/22; H05K 5/006; H05K 5/0069; H05K 5/0247; H05K 5/03; H05K 5/06; H05K 5/062; H05K 5/061; H05K 5/069; G06F 19/322; G06F 1/1628; G06F 3/03543; G06F 3/047; H04M 1/18; H04M 1/0262; Y10T 428/13
USPC ............. 361/679.55–679.58, 679.01, 679.02, 361/679.08, 679.09, 679.3, 679.27, 679.26, 361/679.21; 455/575.1–575.4; 379/433.11–433.13; 428/34.1
See application file for complete search history.

(56) References Cited

U.S. PATENT DOCUMENTS 5,550,712 A * 8/1996 Crockett ........................ 361/752
5,621,311 A * 4/1997 Kamiya ........................ 324/156
(Continued)

FOREIGN PATENT DOCUMENTS

| CN | 101626673 A | 1/2010 |
|---|---|---|
| JP | 2007-312255 | 11/2007 |
| JP | 2011-119960 | 6/2011 |
| JP | 2011-250076 | 12/2011 |

OTHER PUBLICATIONS

JPOA—Office Action of Japanese Patent Application No. 2012-059713 dated Aug. 25, 2015, with English translation of the relevant part, p. 1, line 21 to p. 2, line 13 & p. 3, line 18 to line 19 of the Office Action.

(Continued)

*Primary Examiner* — Anthony Haughton
*Assistant Examiner* — Ingrid Wright
(74) *Attorney, Agent, or Firm* — Fujitsu Patent Center

(57) ABSTRACT

An electronic device includes a first housing member having an opening that houses a housed object; a second housing member that is mated with the first housing member; a cover member that covers the opening; and a sealing member that is integrated with the first housing member by two-color molding, seals a seam between a perimeter of the opening of the first housing member and the cover member as well as a seam between the first housing member and the second housing member, and contacts side surfaces of the housed object when the housed object is housed in the opening.

6 Claims, 16 Drawing Sheets

(56) References Cited

U.S. PATENT DOCUMENTS

| | | | |
|---|---|---|---|
| 7,983,028 B2* | 7/2011 | Park et al. | 361/679.21 |
| 2011/0133409 A1 | 6/2011 | Shibuya | |
| 2012/0162880 A1* | 6/2012 | Yoon et al. | 361/679.01 |
| 2012/0320503 A1* | 12/2012 | Yturralde et al. | 361/679.01 |

OTHER PUBLICATIONS

CNOA—First Notification of Office Action for Chinese Patent Application No. 201310012180.0 dated Jul. 1, 2015, with partial English translation.

* cited by examiner

ELECTRONIC DEVICE AND SEALED STRUCTURE

CROSS REFERENCE TO RELATED APPLICATIONS

This application is based upon and claims the benefit of priority of the prior Japanese Patent Application No. 2012-059713, filed on Mar. 16, 2012, the entire contents of which are incorporated herein by reference.

FIELD

The embodiment discussed herein is related to an electronic device and a sealed structure.

BACKGROUND

Conventionally, as a sealed structure for an electronic device, one side of a housing is integrated with a packing member by insert molding or two-color molding; and by pressing the other side of the housing to apply pressure to the packing member, fluids can be prevented from entering the electronic device from seams where surfaces of the housing sides meet (see, for example, Japanese Laid-Open Patent Publication No. 2011-119960).

Nonetheless, with the conventional sealed structure, a problem arises in that a packing member is also necessary to prevent fluids from seeping through at the edges of a cover of an opening for housing the battery, disposed in the housing and therefore, the number of packing members increases, increasing the size of the electronic device and inviting increased cost.

SUMMARY

According to an aspect of an embodiment, an electronic device includes a first housing member having an opening that houses a housed object; a second housing member that is mated with the first housing member; a cover member that covers the opening; and a sealing member that is integrated with the first housing member by two-color molding, seals a seam between a perimeter of the opening of the first housing member and the cover member as well as a seam between the first housing member and the second housing member, and contacts side surfaces of the housed object when the housed object is housed in the opening.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments of the present invention will be explained with reference to the accompanying drawings.

Figure 1:
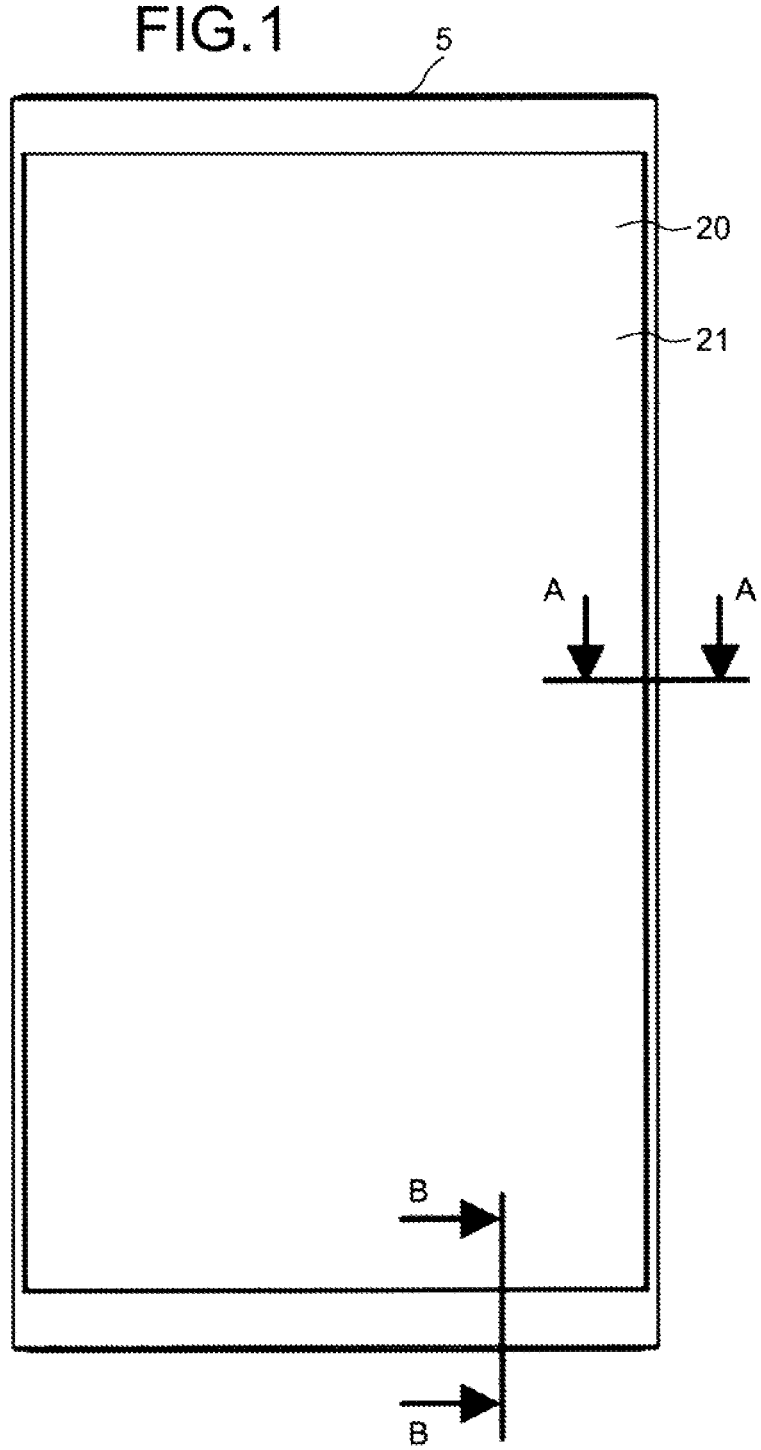
FIG. 1 is a front view of an electronic device according to an embodiment.
Figure 2:
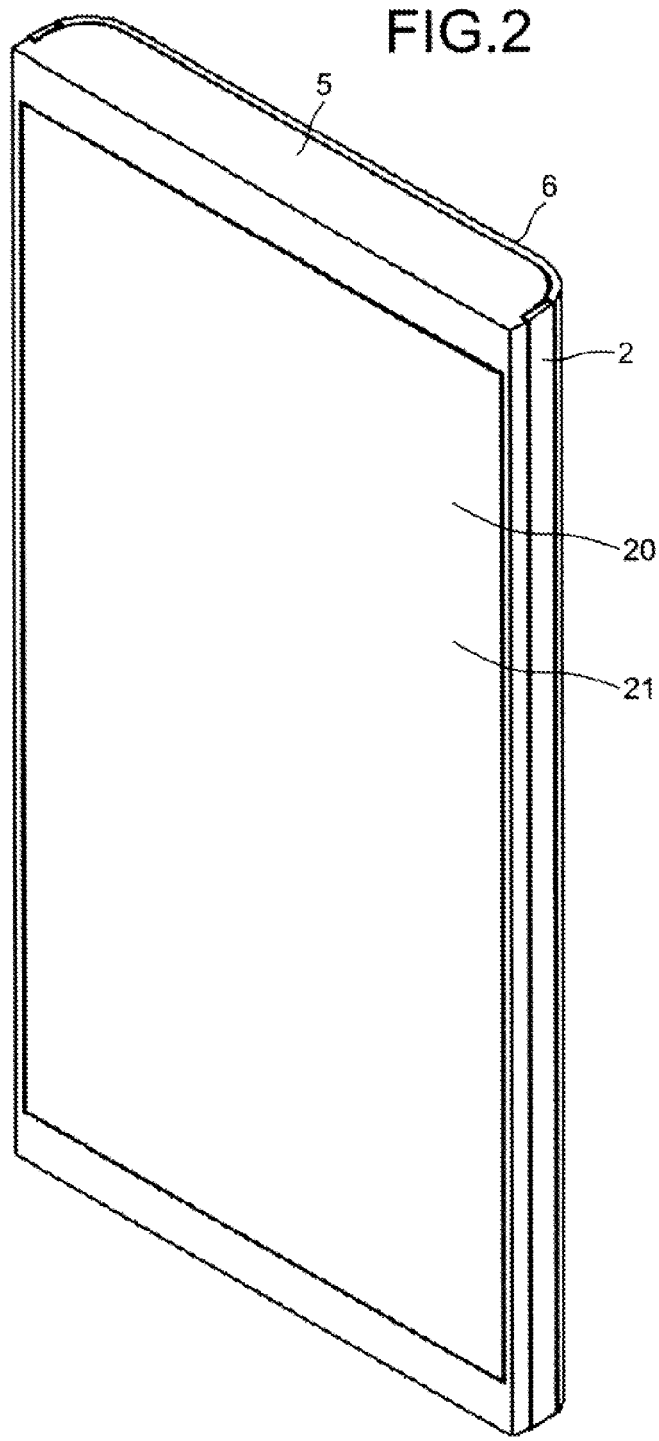
FIG. 2 is a perspective view of the electronic device as viewed from the front.
Figure 3:
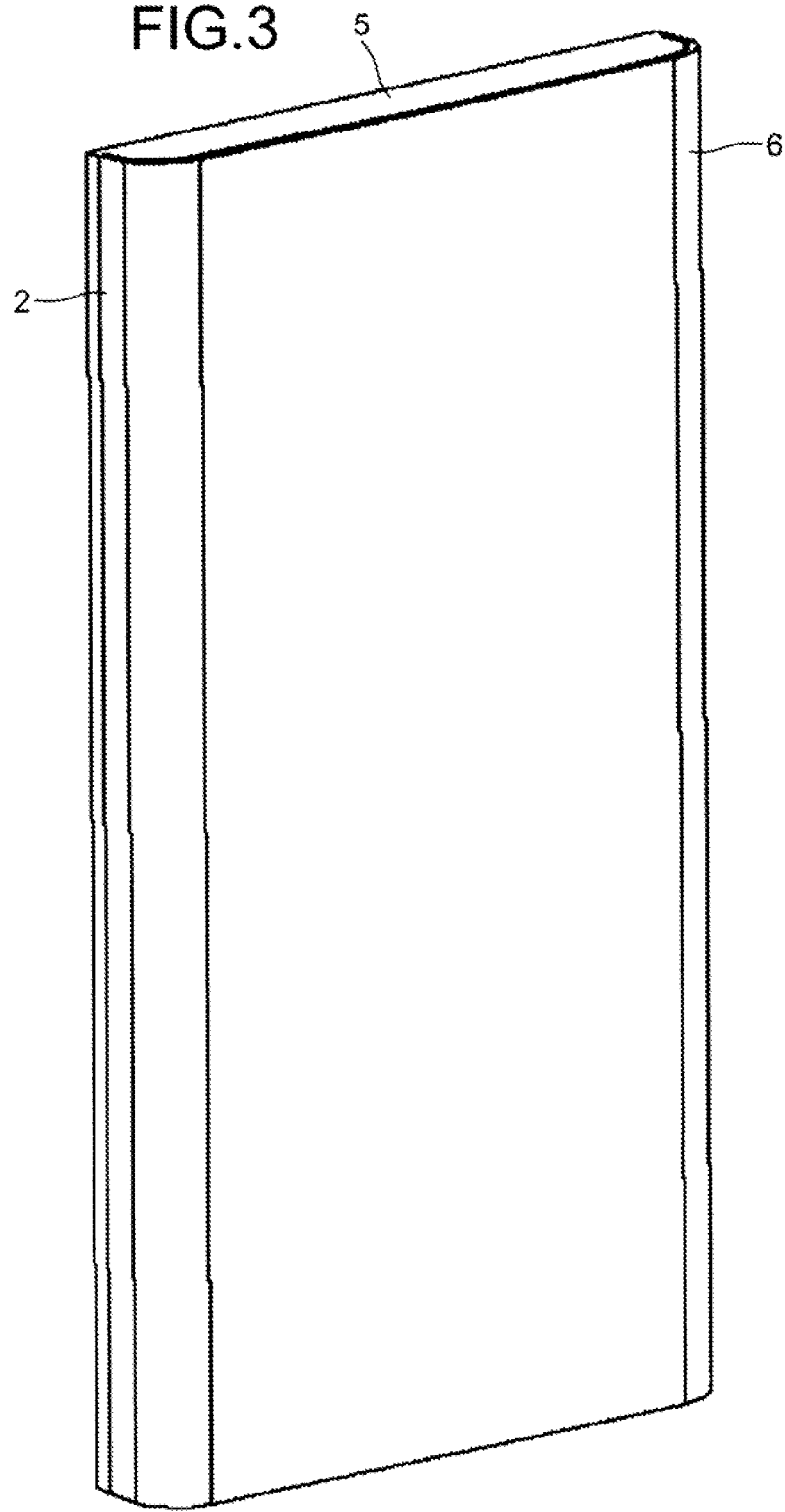
FIG. 3 is a perspective view of the electronic device as viewed from the rear.
Figure 4:
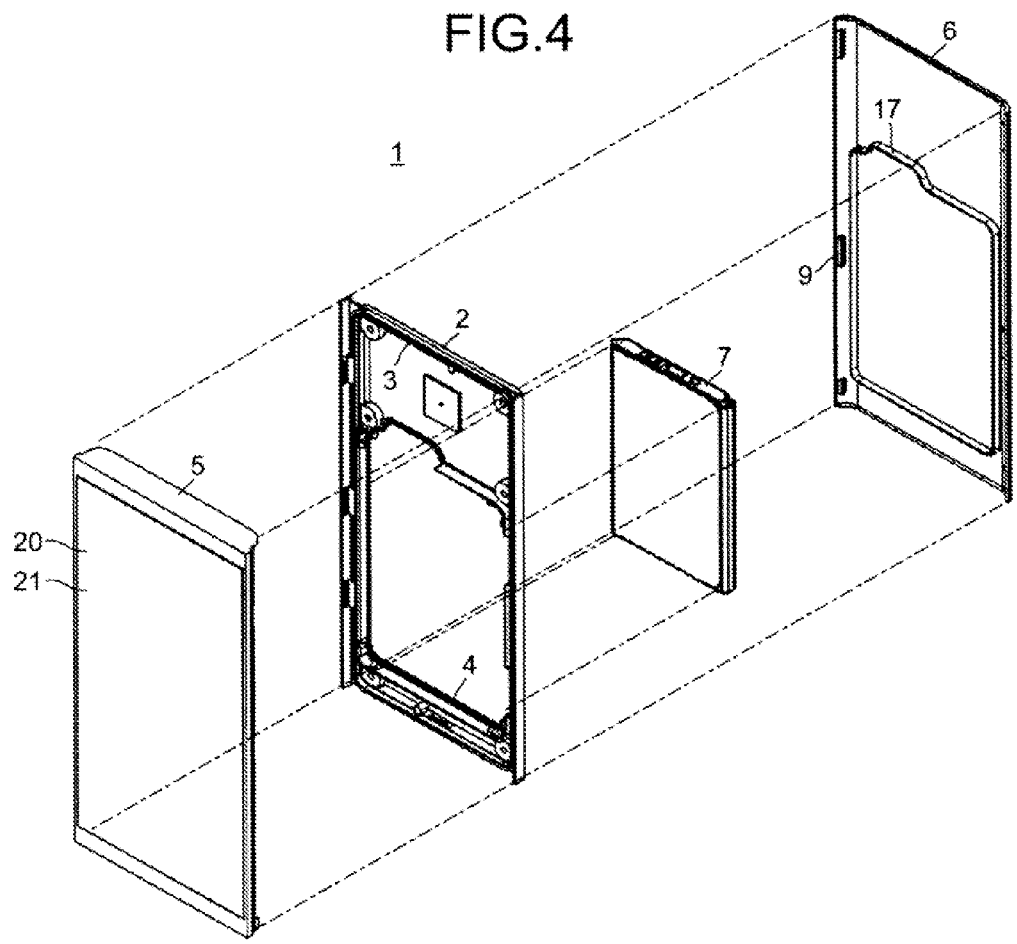
FIG. 4 is an exploded perspective view of the electronic device.
Figure 5:
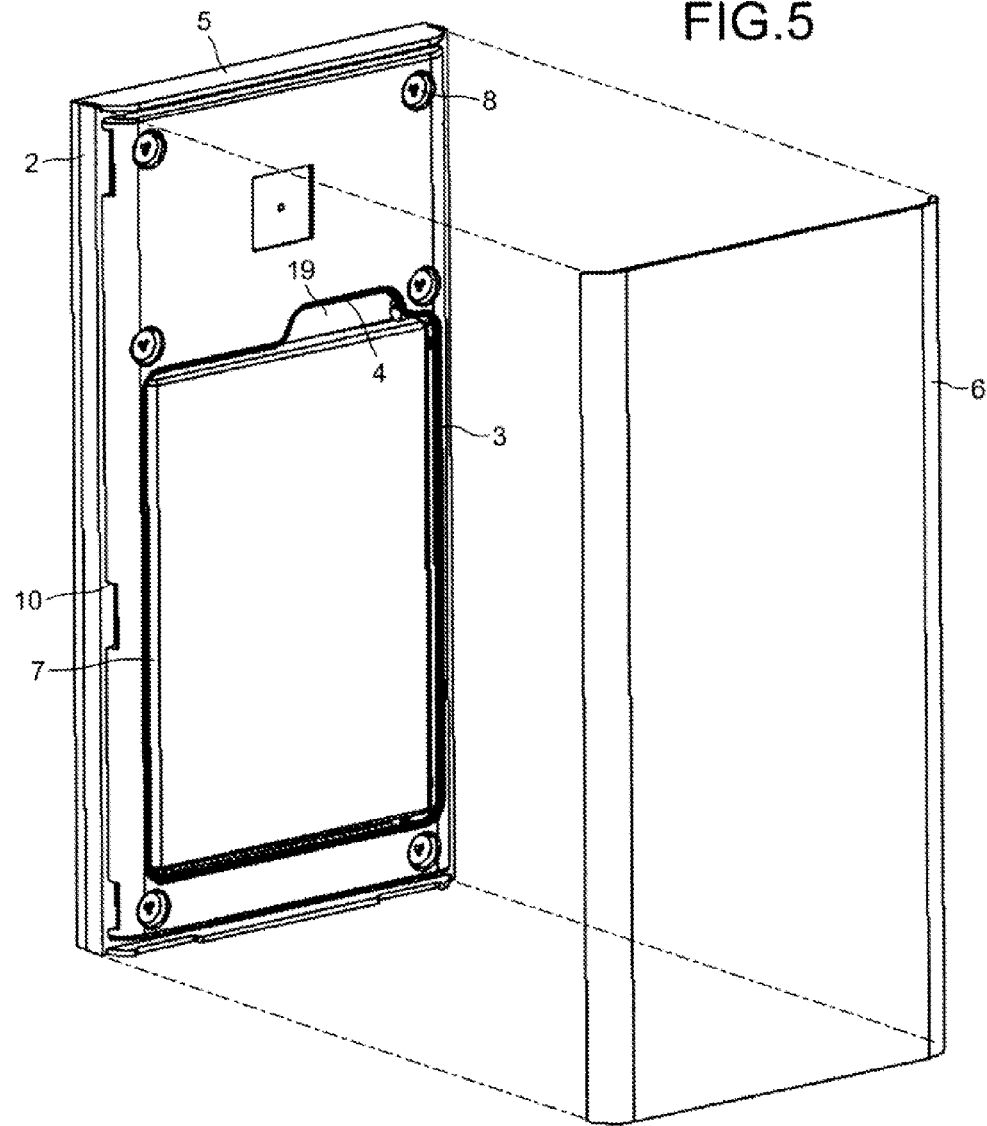
FIG. 5 is a perspective view of the electronic device as viewed from the same angle in FIG. 3 and depicts a state in which a cover member has been removed from the electronic device.

FIGS. 1 to 5 are diagrams depicting an electronic device according to an embodiment. FIG. 1 is a front view; FIG. 2 is a perspective view as viewed from the front; FIG. 3 is a perspective view as viewed from the rear; FIG. 4 is an exploded perspective view; and FIG. 5 is a perspective view as viewed from the same angle in FIG. 3 and a state in which a cover member has been removed from the electronic device.

As depicted in FIGS. 1 to 5, an electronic device 1 includes a first housing member 2, a sealing member 3, a second housing member 5, a cover member 6, and a housed object 7. The first housing member 2 has an opening 4 in which the housed object 7 is housed. In the electronic device 1, the first housing member 2 and the second housing member 5 are mated, the housed object 7 is housed in the opening 4, and the opening 4 is sealed by the cover member 6. The sealing member 3 prevents substances such as water, vapors, and fine particles that are undesirable from the perspective of the electronic device 1, from entering the electronic device 1.

The first housing member 2 is attached to the first housing member 2 by, for example, multiple screws 8. The screws are not depicted in the exploded perspective view depicted in FIG. 4. For example, multiple protrusions 9 are disposed on the cover member 6, while multiple grooves 10 are disposed in the first housing member 2. The cover member 6 is attached to the first housing member 2 by, for example, fitting each of the protrusions 9 into a corresponding groove 10.

Figure 6:
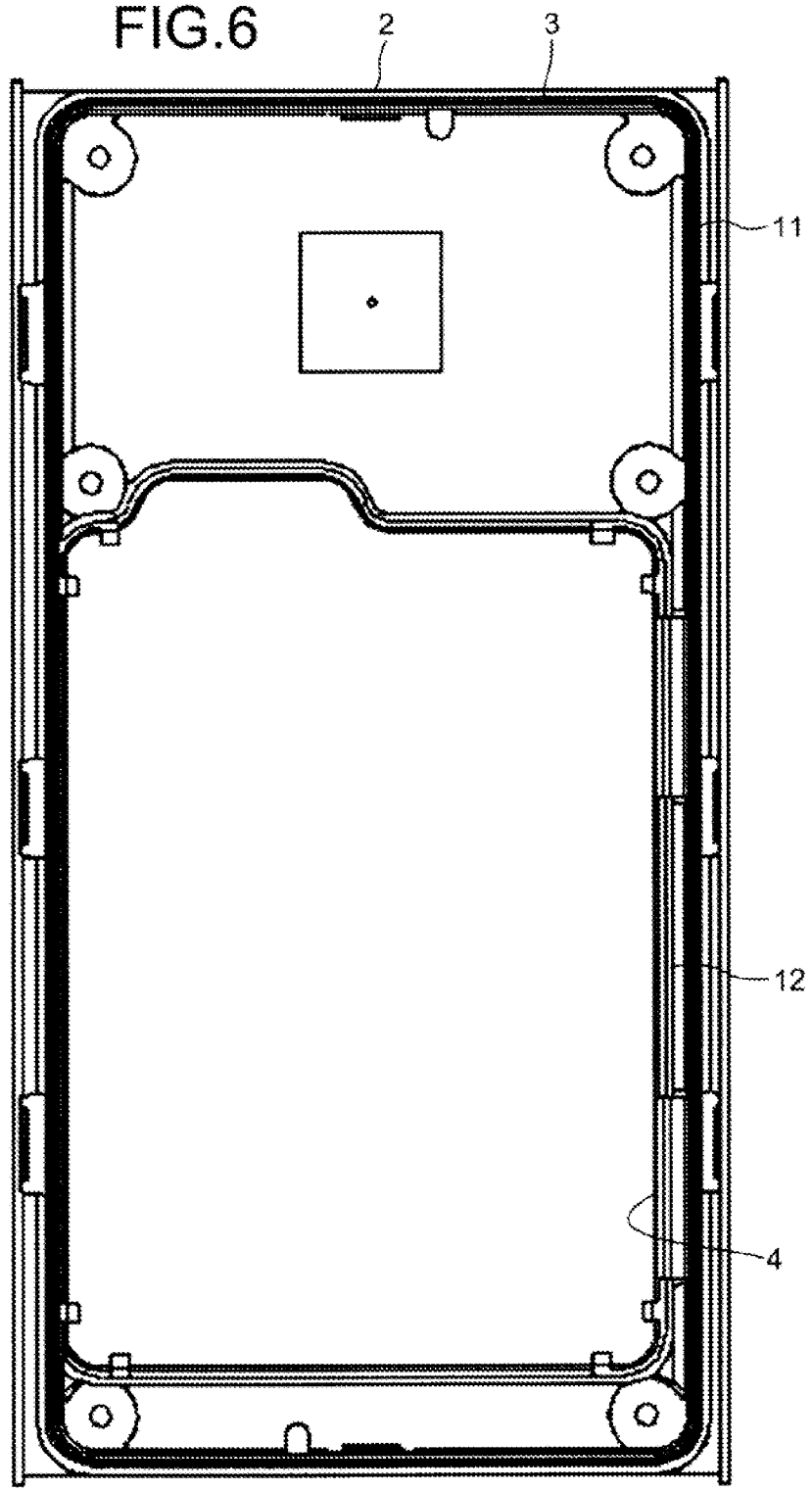
FIG. 6 is a front view of a first housing member integrated with a sealing member.
Figure 7:
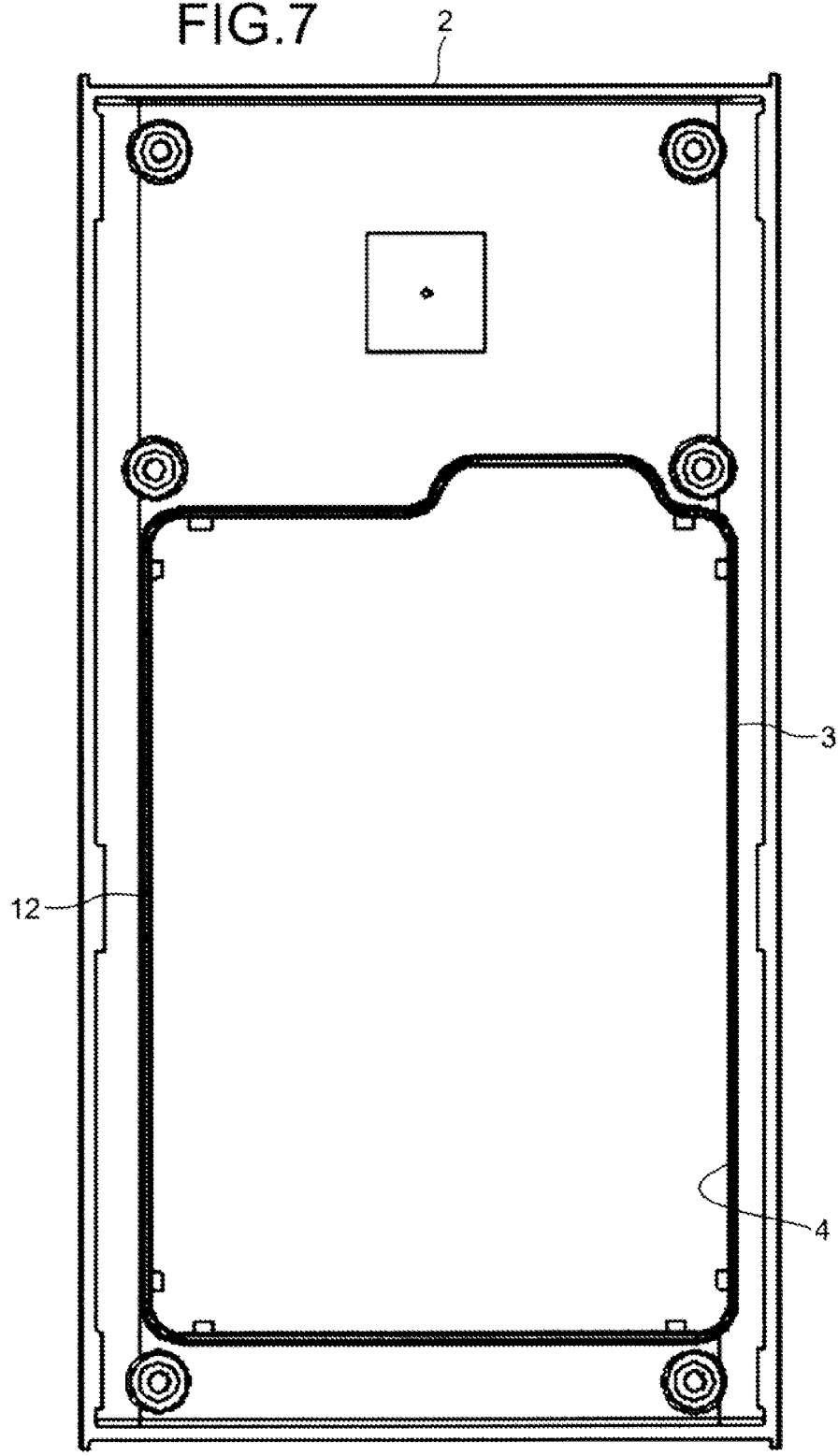
FIG. 7 is a rear view of the first housing member integrated with the sealing member.
Figure 8:
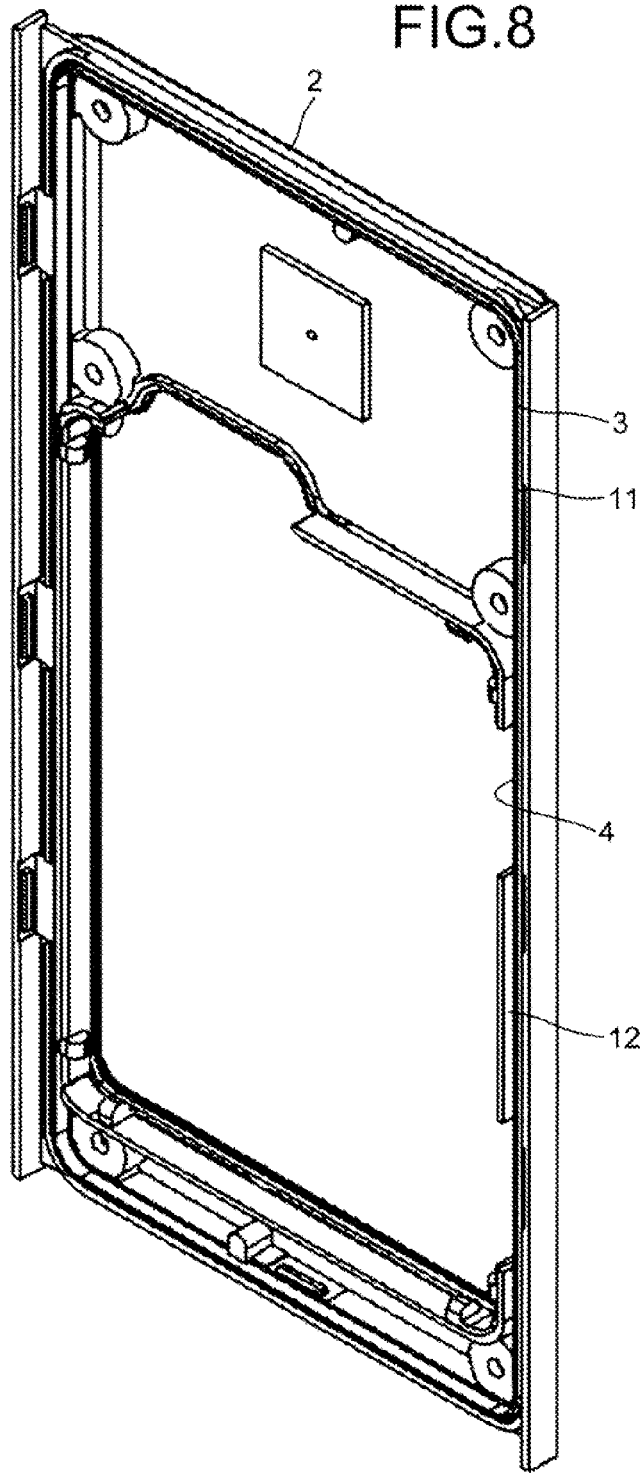
FIG. 8 is a perspective view as viewed from the front.
Figure 9:
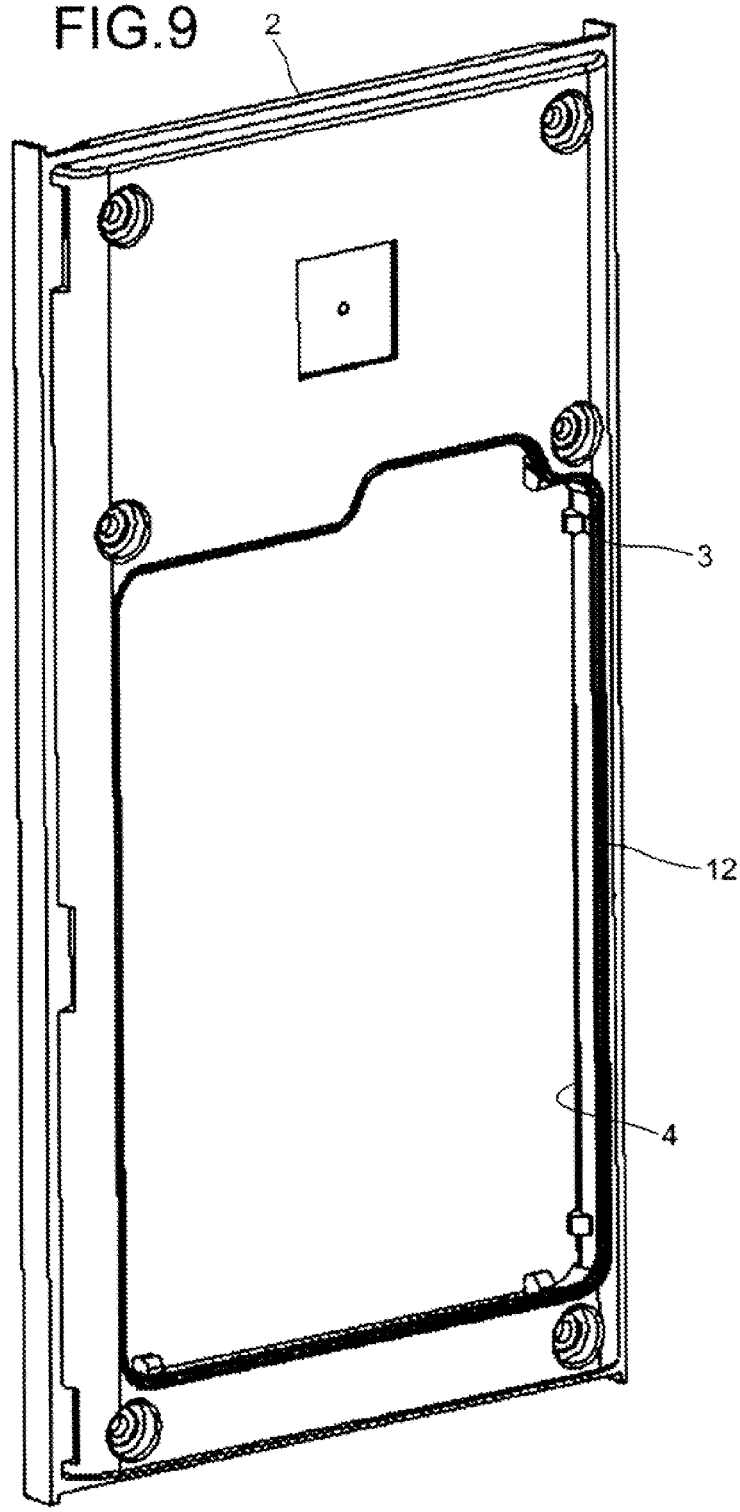
FIG. 9 is a perspective view of the first housing member integrated with the sealing member as viewed from the rear.
Figure 10:
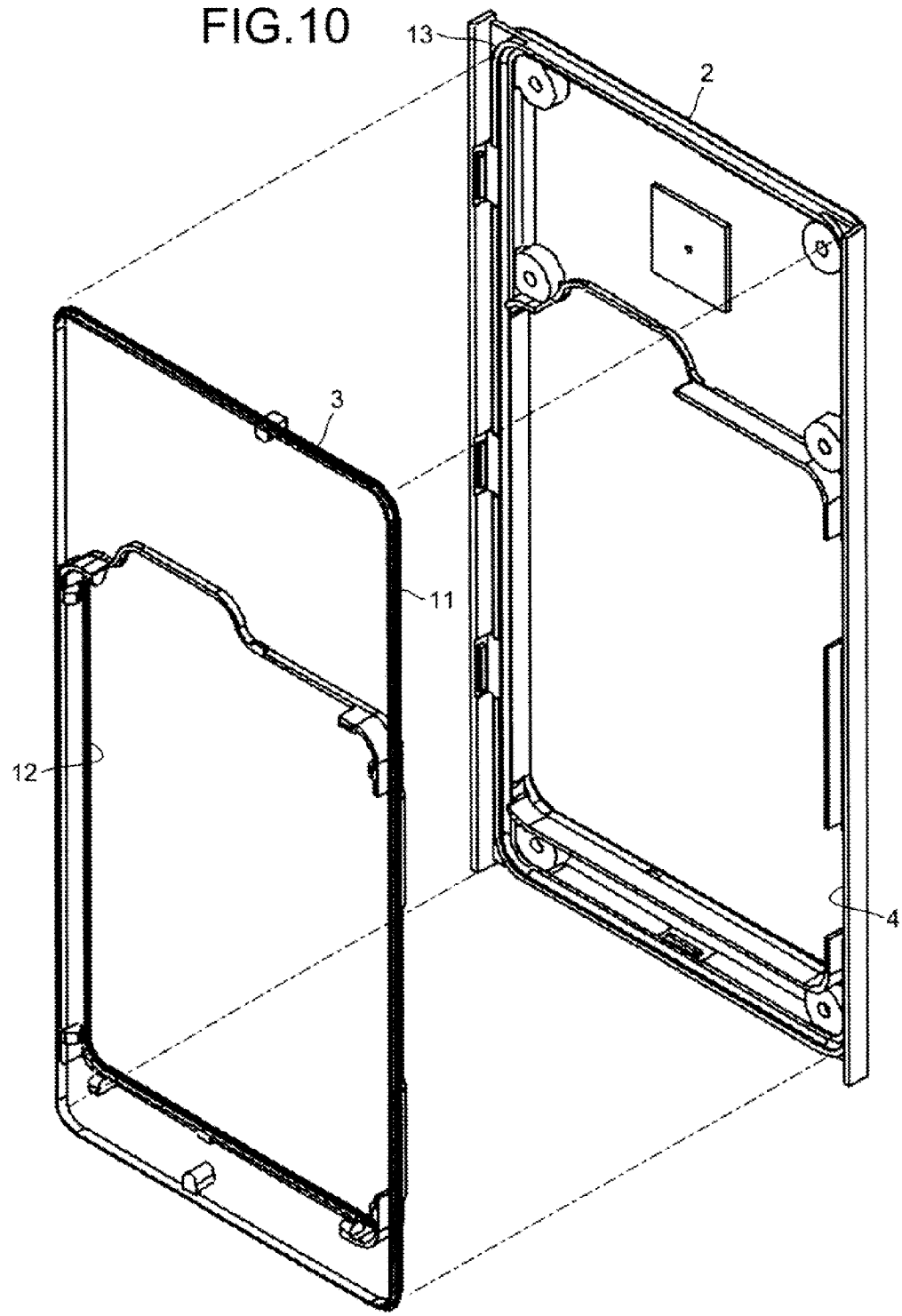
FIG. 10 is a perspective view independently depicting the sealing member and the first housing member depicted in FIG. 8.

FIGS. 6 to 9 are diagrams depicting the first housing member integrated with the sealing member. FIG. 6 is a front view; FIG. 7 is a rear view; FIG. 8 is a perspective view as viewed from the front; and FIG. 9 is a perspective view as viewed from the rear. FIG. 10 is a perspective view independently depicting the sealing member and the first housing member depicted in FIG. 8.

As depicted in FIGS. 6 to 10, the sealing member 3 is integrated with the first housing member 2 by insert molding. The sealing member 3 has a first ring unit 11 and a second ring unit 12 (also refer to FIGS. 11 to 14).

The first ring unit 11 is shaped to follow an outer edge of the first housing member 2, and in the example depicted, is of a shape that is substantially rectangular. The first ring unit 11 is formed along the outer edge of the first housing member 2, in a convex section 13 (refer to FIG. 10) that is for forming the sealing member and that is disposed along an outer edge of the first housing member 2.

The second ring unit 12 is shaped to follow an inner edge of the opening 4, e.g., in the example depicted, is of a shape that is substantially rectangular. The second ring unit 12 is disposed along the inner edge of the opening 4.

Figure 11:
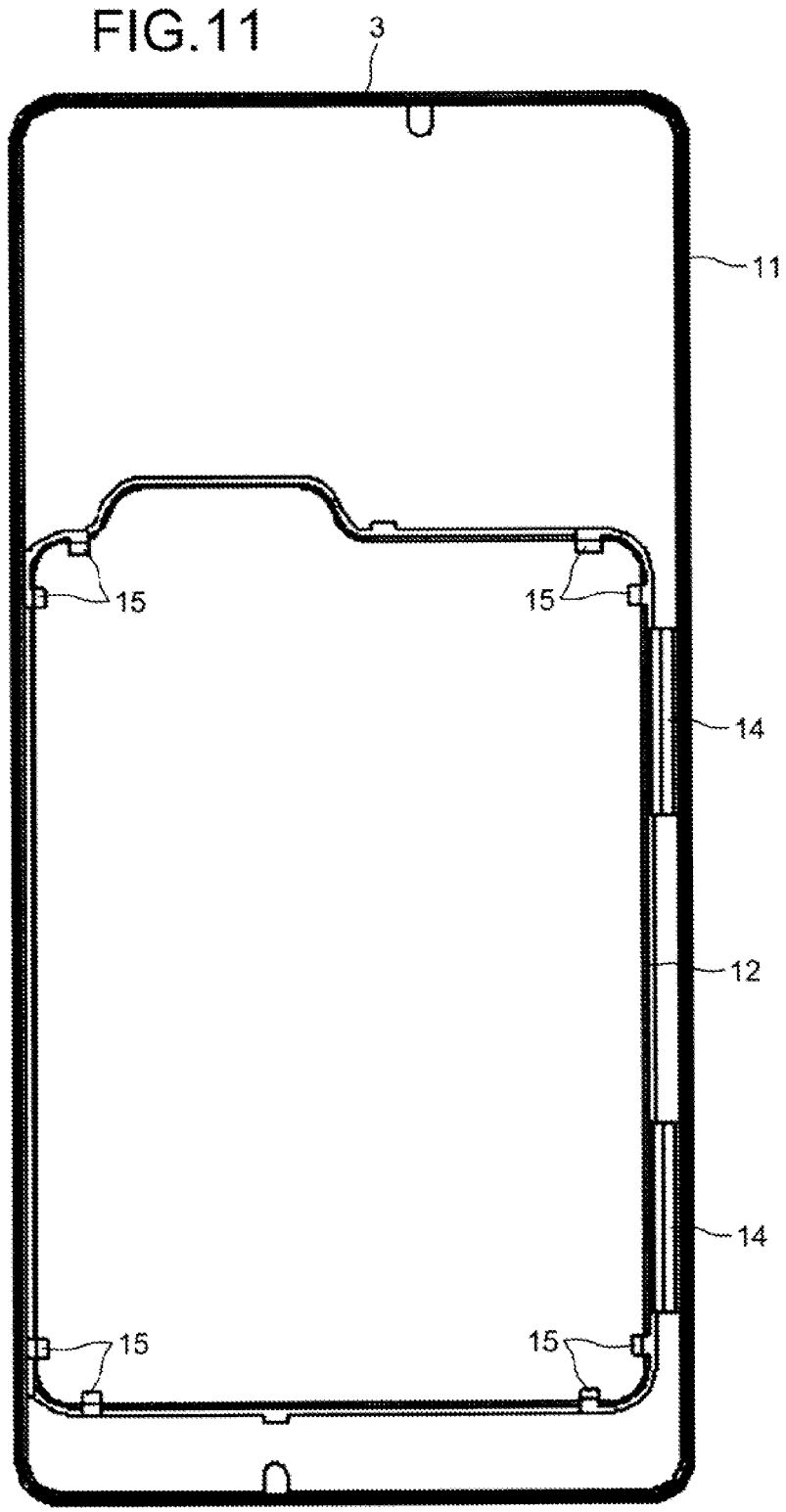
FIG. 11 is a front view of the sealing member.
Figure 12:
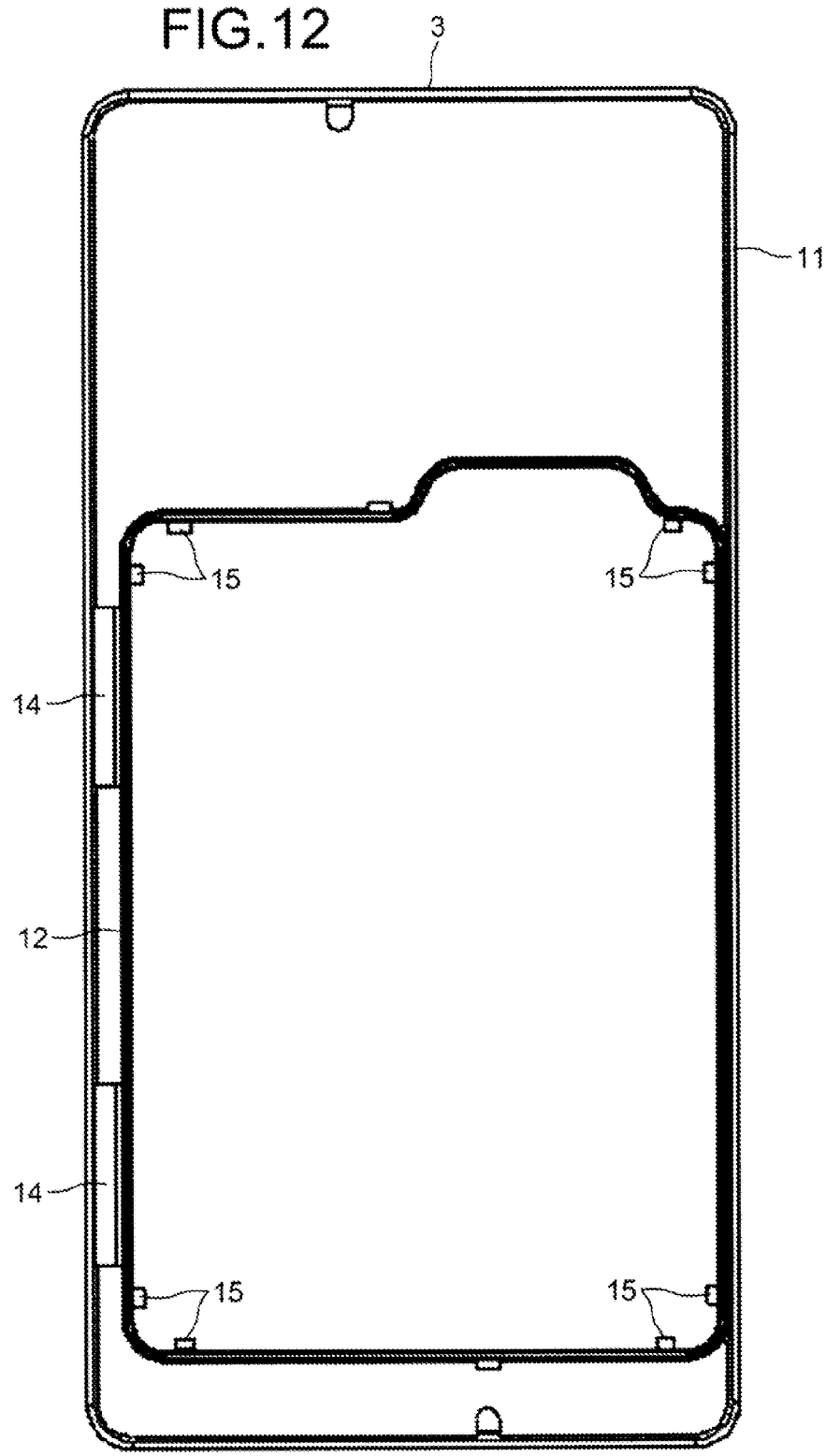
FIG. 12 is a rear view of the sealing member.
Figure 13:
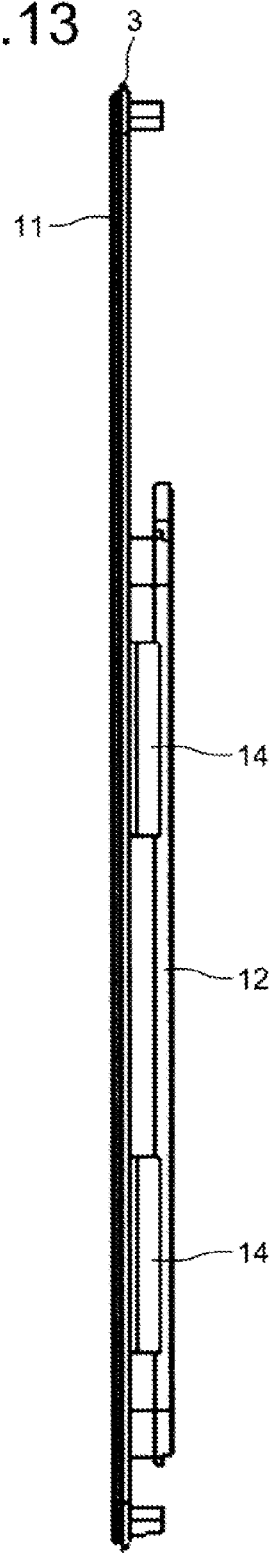
FIG. 13 is a side view of the sealing member.
Figure 14:
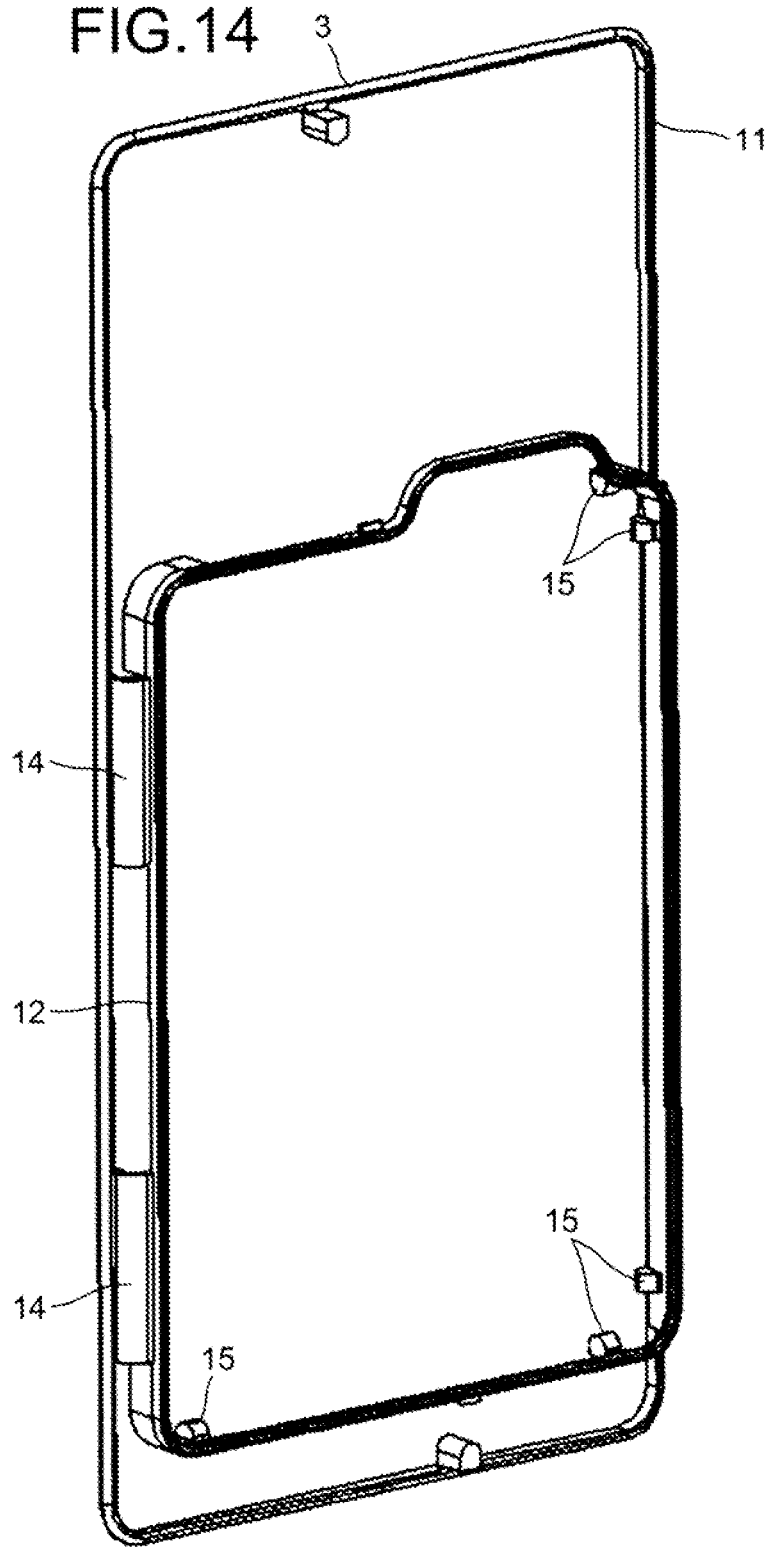
FIG. 14 is a perspective view of the sealing member as viewed from the rear.

FIGS. 11 to 14 diagrams of the sealing member. FIG. 11 is a front view; FIG. 12 is a rear view; FIG. 13 is a side view; and FIG. 14 is a perspective view as viewed from the rear.

As depicted in FIGS. 11 to 14, in the sealing member 3, the first ring unit 11 and the second ring unit 12 are coupled by a coupler 14. The second ring unit 12, for example, may be formed as a band-shape having a dimension of depth that is oriented parallel to the depth of the opening 4. The band-shaped portion of the second ring unit 12 may be fixed to an inner surface of the opening 4 by insert molding.

For example, multiple projections 15 facing inward are disposed on the second ring unit 12. The projections 15 are formed to contact a side surface of the housed object 7. As depicted in the example, the projections 15 may be formed such that each of the 4 side surfaces of the housed object 7 are contacted at, for example, 2 sites.

Figure 15:
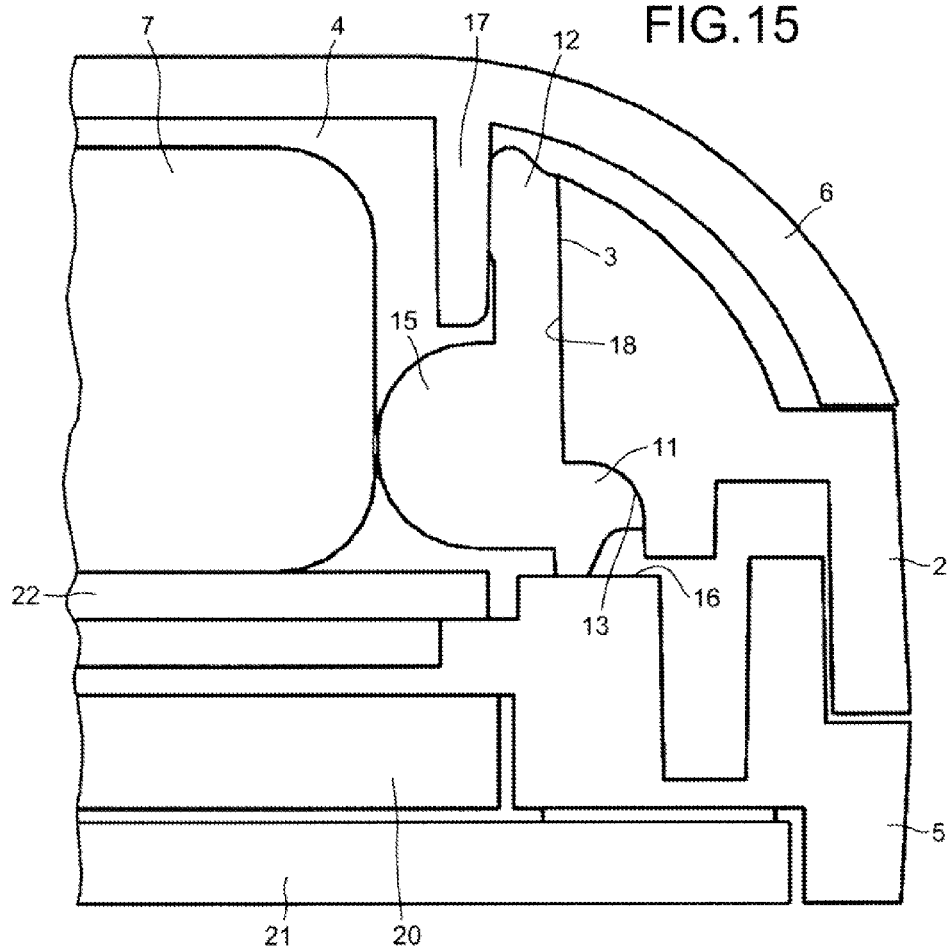
FIG. 15 is a cross-sectional view at line A-A depicted in FIG. 1.
Figure 16:
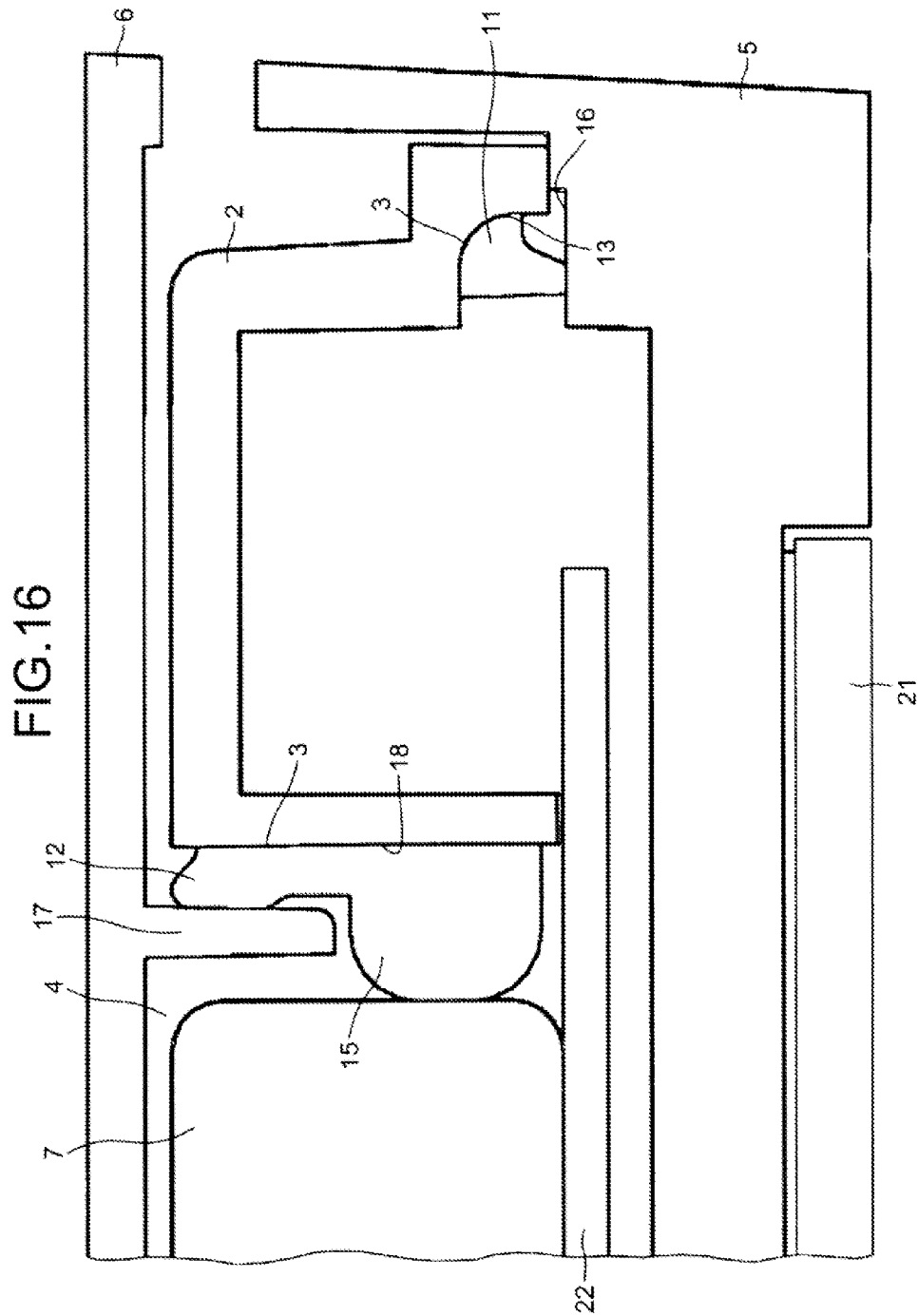
FIG. 16 is a cross-sectional view at line B-B depicted in FIG. 1.

The sealed structure will be described. FIG. 15 is a cross-sectional view at line A-A depicted in FIG. 1. FIG. 16 is a cross-sectional view at line B-B depicted in FIG. 1. As depicted in FIGS. 15 and 16, the first ring unit 11 of the sealing member 3 contacts a receiving section 16 disposed along the outer edge of the second housing member 5, at a site facing the convex section 13 for forming the sealing member, whereby the seam between the first housing member 2 and the second housing member 5 is sealed.

A protruding process 17 may be disposed on a back side of the cover member 6 (refer also to FIG. 4). The protruding process 17 is disposed on the cover member 6, at a site that faces an inner surface 18 of the opening 4. The second ring unit 12 of the sealing member 3 is sandwiched between the protruding process 17 and the inner surface 18 of the opening 4, and contacts both the protruding process 17 and the inner surface 18 of the opening 4. Thus, the seam between the perimeter of the opening 4 disposed in the first housing member 2 and the cover member 6 is sealed.

The projections 15 of the sealing member 3 contact side surfaces of the housed object 7 housed in the opening 4, whereby the housed object 7 is supported stably in the opening 4, for example, from 4 directions. The shape of portions of the projections 15 contacting the side surfaces of the housed object 7 may be curved as depicted in the example or may be planar.

Configuration may be such that rather than the sealing member 3 partially contacting side surfaces of the housed object 7 via the projections 15, the second ring unit 12 of the sealing member 3 contacts the housed object 7 along the entire perimeter or along substantially the entire perimeter of the side surfaces of the housed object 7. For example, as in the example depicted in FIG. 5, excluding a convex section 19 providing finger access to a side surface of the housed object 7 in the removal of the housed object 7 from the first housing member 2, the second ring unit 12 (in FIG. 5, reference numeral 12 is omitted) of the sealing member 3 may contact substantially the entire perimeter of the side surfaces of the housed object 7.

A mobile telephone device or a smartphone may be given as one example of the electronic device 1. Here, an example of an application to a smartphone will be described.

In the case of application to a smartphone, the second housing member 5, for example, may be a front case. As depicted in FIGS. 1, 2, 4, 15, and 16, at a front side of the front case, a display panel 20 and a touch panel 21 may be disposed. Further, at a back side of the front case, a circuit board 22 may be housed.

The first housing member 2, for example, may be a rear case. The cover member 6, for example, may be a rear cover. The front case, the rear case, and the rear cover may be members made of a hard resin such as acrylonitrile-butadiene-styrene (ABS) resin and polycarbonate resin and molded from a metal mold, or may be members made of a metal such as aluminum.

The sealing member 3 may be a member made of a soft resin such as polyester elastomer, styrene elastomer, and olefin elastomer. The housed object 7 may be, for example, a battery.

According to the embodiment, the sealing member 3 seals the second housing member 5 to the first housing member 2 and further seals the cover member 6 that covers the opening 4 of the first housing member 2, whereby the number of sealing members can be reduced compared to using separate sealing members. Therefore, the size of the electronic device 1 can be reduced. Further, cost reduction of the electronic device 1 can be realized.

Further, for example, in a smartphone, since the second ring unit 12 of the sealing member 3 contacts the battery housed in the smartphone and thereby, suppresses slack in the housing of the battery, the shock resistance of the battery can be improved. Therefore, even if the smartphone is subject to external forces consequent to, for example, vibrations and dropping of the smartphone, damage to the battery can be prevented.

The electronic device 1 is not limited to a smartphone. The electronic device 1 may be an electronic device having a structure in which housing members as well as a cover member covering an opening are sealed by a sealing member, such as in mobile information terminals including mobile telephones, computers and personal digital assistants (PDAs), and various types of measuring instruments. Further, the housed object 7 is not limited to a battery. The housed object may be, for example, an apparatus that must be shock resistant such as a hard disk drive apparatus.

The electronic device and sealed structure enable a reduction in electronic device size and further enable cost reductions of the electronic device to be realized.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. An electronic device comprising:
    a first housing member having an opening that houses a housed object;
    a second housing member that is mated with the first housing member;
    a cover member that covers the opening; and
    a sealing member wherein
    the sealing member is integrated with the first housing member by two-color molding, the sealing member seals a seam between a perimeter of the opening of the first housing member and the cover member, the sealing member seals a seam between the first housing member and the second housing member, and the sealing member contacts side surfaces of the housed object when the housed object is housed in the opening.

2. The electronic device according to claim 1, wherein the sealing member partially contacts the side surfaces of the housed object, at multiple sites.

3. The electronic device according to claim 1, wherein the sealing member can contact the sides of the housed object along an entire perimeter or along substantially the entire perimeter of the side surfaces of the housed object.

4. A sealed structure, wherein a seam between a first housing member and a second housing member mated with the first housing member is sealed by a sealing member, a seam between a perimeter of an opening disposed in the first housing member and a cover member covering the opening is sealed by the sealing member, and the sealing member contacts side surfaces of a housed object housed in the opening.

5. The sealed structure according to claim 4, wherein the sealing member partially contacts the side surfaces of the housed object, at multiple sites.

6. The sealed structure according to claim 4, wherein the sealing member contacts the side surfaces of the housed object along an entire perimeter or along substantially the entire perimeter of the side surfaces.

* * * * *